(12) United States Patent
Martin

(10) Patent No.: US 10,348,263 B1
(45) Date of Patent: Jul. 9, 2019

(54) V-BAND DIGITAL CONTROL BANDPASS AMPLIFIER

(71) Applicant: IQ-Analog Corporation, San Diego, CA (US)

(72) Inventor: Kenneth Martin, Mississauga (CA)

(73) Assignee: I-Q Analog Corporation, San Diego, CA (US)

( * ) Notice: Subject to any disclaimer, the term of this patent is extended or adjusted under 35 U.S.C. 154(b) by 0 days.

(21) Appl. No.: 16/106,339

(22) Filed: Aug. 21, 2018

(51) Int. Cl.
| | |
|---|---|
| *H03G 3/10* | (2006.01) |
| *H03G 3/30* | (2006.01) |
| *H03F 3/195* | (2006.01) |
| *H03F 3/68* | (2006.01) |
| *H03M 7/16* | (2006.01) |
| *H03H 7/06* | (2006.01) |

(52) U.S. Cl.
CPC .......... *H03G 3/3089* (2013.01); *H03F 3/195* (2013.01); *H03F 3/68* (2013.01); *H03G 3/3063* (2013.01); *H03G 3/3078* (2013.01); *H03F 2200/165* (2013.01); *H03F 2200/171* (2013.01); *H03F 2200/267* (2013.01); *H03F 2200/294* (2013.01); *H03F 2200/301* (2013.01); *H03F 2200/451* (2013.01); *H03H 7/06* (2013.01); *H03M 7/165* (2013.01)

(58) Field of Classification Search
CPC .. H03G 3/3089; H03G 3/3078; H03G 3/3063; H03G 1/0088; H03G 1/0023; H03G 3/3042; H03G 3/3036; H03G 3/001; H03H 7/06; H03M 7/165; H03F 1/223; H03F 1/22; H03F 2200/294; H03F 3/68; H03F 3/195; H03F 2200/171; H03F 2200/451; H03F 2200/165; H03F 2200/267; H03F 2200/301

USPC .................................. 330/51, 278, 279, 311
See application file for complete search history.

(56) References Cited

U.S. PATENT DOCUMENTS

| | | | |
|---|---|---|---|
| 6,566,963 B1 * | 5/2003 | Yan .......................... | H03F 1/22 330/283 |
| 6,724,259 B2 * | 4/2004 | Tanabe ..................... | H03F 1/22 330/278 |

(Continued)

OTHER PUBLICATIONS

A.S. Sedra and P.O. Brackett, Filter Theory and Design. Matrix Publishers, 1978, pp. 216-233.
A. Ismail and A.A. Abidi, "A 3-10GHz Low-Noise Amplifier with Wideband . . . ," IEEE J. of Solid_State Circ., vol. 39, No. 11, pp. 2269-2277, Dec. 2004,10.1109/JSSC.2004.836344.

(Continued)

*Primary Examiner* — Khanh V Nguyen
(74) *Attorney, Agent, or Firm* — Law Office of Gerald Maliszewski; Gerald Maliszewski

(57) ABSTRACT

A digitally controlled amplifier (DCA) has a drive (e.g., bipolar junction) transistor with a base to accept an input signal and a collector to supply an output signal. The DCA also includes n switchable gain amplifier networks (SGANs). Each SGAN has a signal input connected to the collector of the drive transistor, an input to accept a logic signal, and a signal output to supply a switchable gain AC output signal to a load in response to the logic signal. The SGAN signal outputs are connected together, typically in parallel, to supply a digitally controlled AC output gain. An auxiliary SGAN may be connected to supply a constant gain AC output signal. Each of the SGANs may have an identical switchable AC gain and accept an independent logic signal to supply (n+1) levels of digitally controlled AC output gain.

19 Claims, 8 Drawing Sheets

(56) References Cited

U.S. PATENT DOCUMENTS

| | | | | |
|---|---|---|---|---|
| 7,301,403 B2* | 11/2007 | Zhang | ............... | H03F 3/45183 |
| | | | | 330/253 |
| 7,705,680 B2* | 4/2010 | Igarashi | ............... | H03F 1/22 |
| | | | | 330/278 |
| 8,279,008 B2* | 10/2012 | Hsieh | ............... | H03F 1/223 |
| | | | | 330/285 |
| 2003/0034845 A1* | 2/2003 | Sasaki | ............... | H03G 1/0088 |
| | | | | 330/311 |
| 2007/0222515 A1* | 9/2007 | Koutani | ............... | H01L 27/0207 |
| | | | | 330/254 |

OTHER PUBLICATIONS

A.I. Zverev, Handbook of Filter Synthesis. John Wiley & Sons, 1967, pp. 530.
A. Chakraborty, et al., "Design of Gain Optimized Broadband Low Noise Amplifiers at 120 GHz using SiGe Technology", German Microwave Conference, 2010.
I. Kalyoncu, et. al., "A High_Dynamic Range SiGe Low-Noise Amplifier for X-band Radar Applications," Proc. of the 7'th European Microwave Integ. Circ. Conf., pp. 385-388.
R. Schmid, et al., "A Digitally-Controlled Seven-State X-Band SiGe Variable Gain Low Noise Amplifier", IEEE Bipolar/BiCMOS Circuits and Technology Meeting (BCTM), 2014.
M. Alam, et al. "Performance Investigation of dual band millimetre wave SiGe Low Noise Amplifier (LNA)", IEEE ImaRC, 2015.
Min et al., "Ka-Band SiGe HBT Low Phase Imbalance Differential 3-Bit Variable Gain LNA", IEEE Microwave, vol. 18, No. 4, Apr. 2008, pp. 272-275.

* cited by examiner

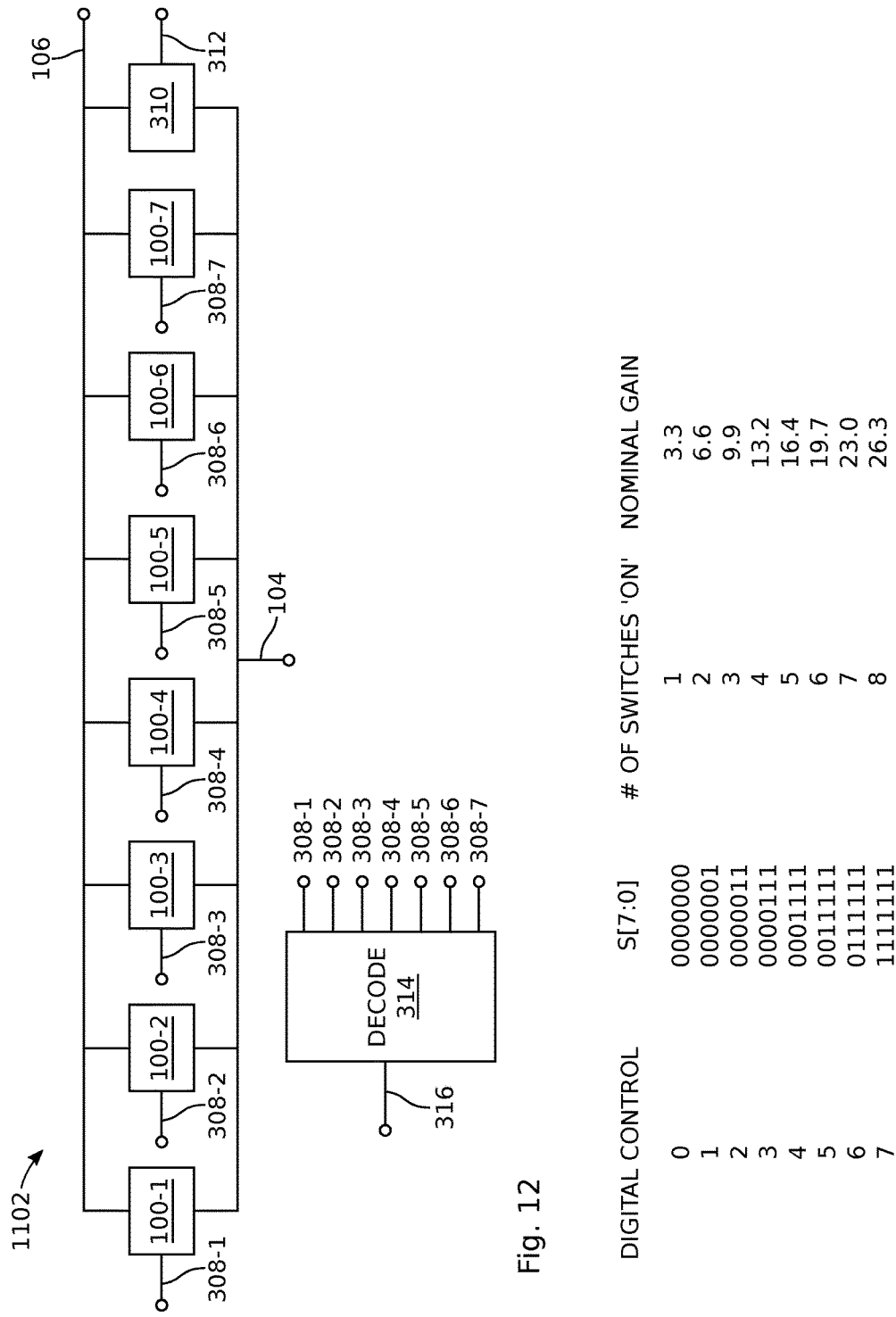

V-BAND DIGITAL CONTROL BANDPASS AMPLIFIER

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to analog communication signal processing and, more particularly, to a system and method for digitally controlling the gain of analog amplifier networks.

2. Description of the Related Art

The typical wireless communications receiver is expected to recover signals at a multitude of input signal levels, both high and low levels. To this end, the receiver may incorporate an attenuator, amplifier, or both. An automatic gain control (AGC) circuit measures the strength of the input signal and uses a negative feedback network to control the loss in an input attenuator and/or gain in an input amplifier. Typically, the feedback network responds rapidly to changing input signal strengths to help supply a gain controlled signal at the optimal signal strength for subsequent analog or digital processing. Unfortunately, the design of feedback network filtering can be intensive and highly susceptible to unintentional variations in component values. These problems become even more challenging when operating at gigahertz (GHz) and V-band (40-75 GHz) frequencies.

It would be advantageous if the control of gigahertz frequency wireless analog input signals could be simplified by digitally switchable increments of bandpass limited gain.

SUMMARY OF THE INVENTION

Disclosed herein is the design of a low-noise radio frequency (RF) digital gain control amplifier intended for communication applications at gigahertz (GHz) frequencies, including an example with a 50 GHz center frequency and a bandwidth of 8-10 GHz. The V-band digital gain control bandpass amplifier is designed to be low-noise and matched at the input and output to 50 ohms. Its gain is highly variable from 3.1 decibels (dB) to 40.5 dB. A 12th order bandpass filter (realized as three 4th order filters) is embedded in the amplifier, and is designed to take advantage of the frequency dependent impedances of the transistors, to minimize component count and to optimize the trade-off between noise and distortion. Exemplary versions of the low-noise V-band amplifier can be made to realize a noise-figure of 1.9 dB and a third order input intercept point (IIP3) of −1.5 dBm. Key components of the V-band amplifier are two digitally controlled amplifiers, which include switchable gain amplifier networks.

Accordingly, a digitally controlled amplifier is provided that includes a drive transistor with a control terminal to accept an input alternating current (AC) signal and a first terminal to supply a first stage AC output signal. Typically, the drive transistor is a common emitter bipolar junction transistor (BJT) with a base control terminal, a collector first terminal, and an emitter connected to a reference voltage such as ground. The amplifier also includes a plurality of switchable gain amplifier networks (SGANs). Each SGAN has a signal input connected to the first terminal of the drive transistor, an input to accept a logic signal, and a signal output to supply a switchable gain AC output signal to a load in response to the logic signal. The SGAN signal outputs are connected together, typically in parallel, to supply a digitally controlled AC output gain. In one aspect, the digitally controlled amplifier also includes an auxiliary SGAN having a signal input connected to the first terminal of the drive transistor, an input to accept a non-varying enabling logic signal, and a signal output to supply a constant gain AC output signal. The auxiliary SGAN signal output is connected to the plurality of SGAN signal outputs.

In another aspect, each of n (integer n>1) number of SGANs has an identical switchable AC gain, and each SGAN accepts an independent logic signal. In this case, the n SGAN signal outputs are summed together to supply (n+1) levels of digitally controlled AC output gain.

Each SGAN includes a first transistor having a first terminal to accept the first stage AC output signal, a second terminal to supply the switchable gain AC output signal, and a control terminal. A second transistor has a first terminal connected to the first terminal of the first transistor, a second terminal to accept a direct current (DC) supply voltage, and a control terminal. Typically, the first and second transistors are bipolar junction transistors, but they may alternatively be field effect transistors in some versions of the SGAN. A first transmission gate has an input to accept a first bias voltage and an output connected to the control terminal of the first transistor, to supply the first bias voltage in response to receiving a logic signal. A second transmission gate has an input to accept a second bias voltage and an output connected to the control terminal of the second transistor, to supply the second bias voltage in response to receiving a complementary logic signal, opposite in polarity to the logic signal. In one aspect, a first bypass capacitor is included having a first terminal connected to the control terminal of the first transistor and a second terminal connected to a first reference voltage. A second bypass capacitor has a first terminal connected to the control terminal of the second transistor and a second terminal connected to a second reference voltage.

The first transmission gate may be made up of a first re-channel metal-oxide-semiconductor field effect transistor (NMOS) having a first source/drain (S/D) accepting the first bias voltage, a second S/D connected to the control terminal of the first transistor, and a gate accepting a first binary logic signal. A first p-channel metal-oxide-semiconductor field effect transistor (PMOS) has a first S/D accepting the first bias voltage, a second S/D connected to the control terminal of the first transistor, and a gate accepting a second binary logic signal, opposite in polarity to the first binary logic signal. The second transmission gate is made up of a second NMOS having a first S/D accepting the second bias voltage, a second S/D connected to the control terminal of the second transistor, and a gate accepting the second binary logic signal. A second PMOS has a first S/D accepting the second bias voltage, a second S/D connected to the control terminal of the second transistor, and a gate accepting the first binary logic signal. The first NMOS and first PMOS may be enabled as a complementary MOS (CMOS) device. Likewise, the second NMOS and second PMOS may also be a CMOS device.

Additional details of the above-described digitally controlled amplifier, as well as a method for digitally controlling the gain of an amplifier network, are provided below.

BRIEF DESCRIPTION OF THE DRAWINGS

FIG. 12 is a schematic block diagram depicting DCA 1102 in greater detail, except in excluding the drive transistor, which is shown in FIG. 11.

FIG. 13A depicts a table cross-referencing digital control, thermometer code, and SGAN gain.

DETAILED DESCRIPTION

Figure 1:
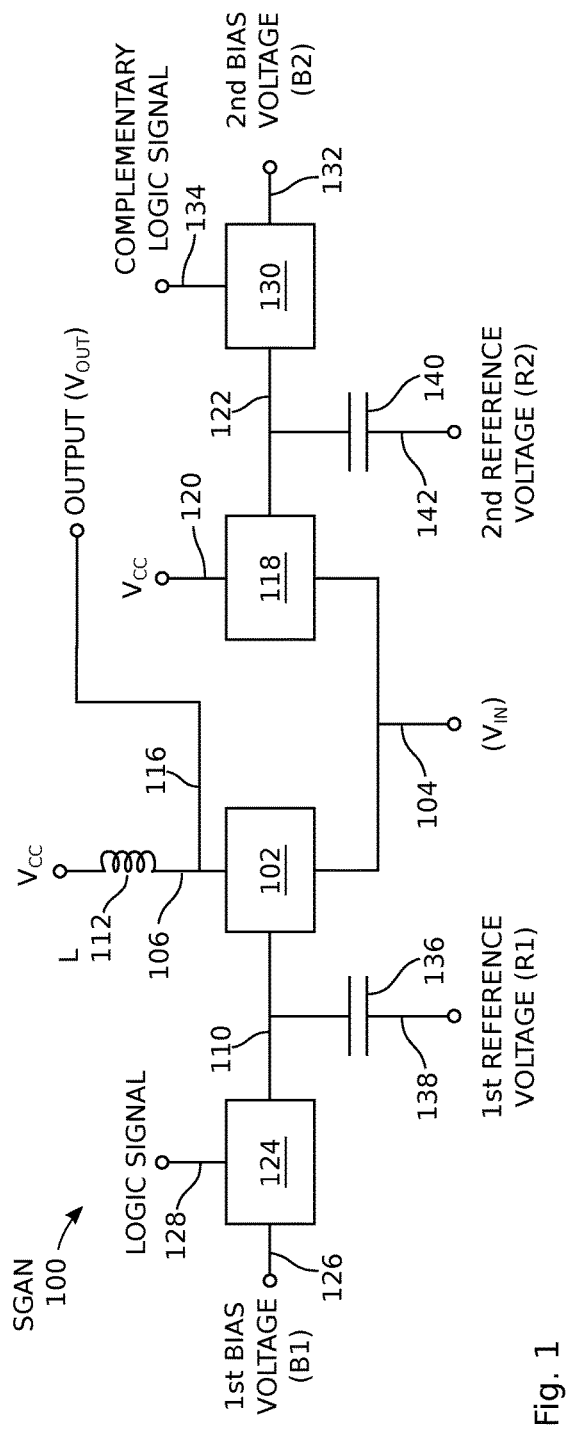
FIG. 1 is a schematic block diagram of a switchable gain amplifier network (SGAN).

FIG. 1 is a schematic block diagram of a switchable gain amplifier network (SGAN). The SGAN 100 comprises a first transistor 102 having a first terminal on line 104 to accept an input alternating current (AC) signal (Vin), a second terminal on line 106 to supply an AC output signal (Vout) to an AC load, represented in part by inductor (L) 112. Also shown is a control terminal on line 110, a direct current (DC) supply voltage (Vcc) connected to L 112, and output port 116. A second transistor 118 has a first terminal connected to the first terminal of the first transistor on line 104, a second terminal on line 120 to accept a DC supply voltage (e.g., Vcc), and a control terminal on line 122. A first transmission gate 124 has an input on line 126 to accept a first bias voltage (B1) and an output connected to the control terminal of the first transistor on line 110, to supply the first bias voltage in response to receiving a logic signal on line 128. A second transmission gate 130 has an input on line 132 to accept the a second bias voltage (B2) and an output connected to the control terminal of the second transistor on line 122, to supply the second bias voltage in response to receiving a complementary logic signal on line 134, opposite in polarity to the logic signal. In one aspect, the first and second bias voltages are the same value.

In an optional aspect, as shown, a first bypass capacitor 136 has a first terminal connected to the control terminal of the first transistor on line 110 and a second terminal connected to a first reference voltage (R1) on line 138. A second bypass capacitor 140 has a first terminal connected to the control terminal of the second transistor on line 122 and a second terminal connected to a second reference voltage (R2) on line 142. Typically, the first and reference voltages are a DC voltage or ground. It is also typical that the first and second references voltage be the same voltage. Bypass capacitors 136 and 140 keep the control voltages relatively constant despite the high frequency signal on lines 104 and 106. They are chosen to be as large as practical without taking up too much silicon area. For example, a size of 0.5 pF bypass capacitor typically meets this tradeoff and significantly improves the operation, as compared to when they are not included.

Figure 2:
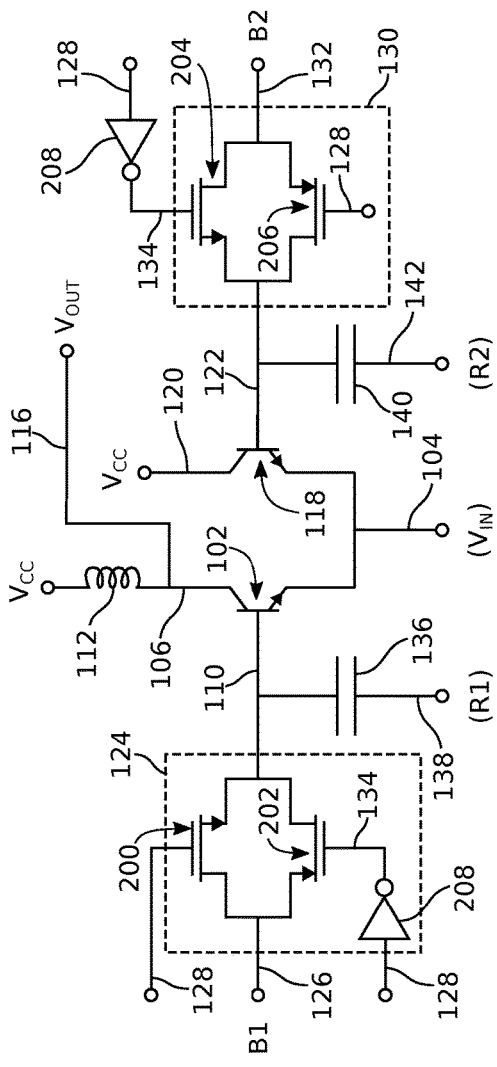
FIG. 2 is a schematic block diagram depicting the SGAN of FIG. 1 in greater detail.

FIG. 2 is a schematic block diagram depicting the SGAN of FIG. 1 in greater detail. In this example, the first transistor 102 and second transistor 118 are depicted as bipolar junction transistors (BJTs), in which case their first terminals are emitters, their second terminals are collectors, and their control terminals are bases. Alternatively but not shown, the first and second transistors may be field effect transistors (FETs). In the case of BJTs, the first and second bias voltages might be more specifically referred to as bias currents or bias signals. The first transmission gate 124 comprises a first n-channel metal-oxide-semiconductor field effect transistor (NMOS) 200 having a first source/drain (S/D) on line 126 accepting the first bias voltage, a second S/D connected to the control terminal of the first transistor on line 110, and a gate accepting a first binary logic signal on line 128. A first p-channel metal-oxide-semiconductor field effect transistor (PMOS) 202 has a first S/D accepting the first bias voltage on line 126, a second S/D connected to the control terminal of the first transistor on line 110, and a gate accepting a second binary logic signal on line 134, opposite in polarity to the first binary logic signal.

The second transmission gate 130 comprises a second NMOS 204 having a first S/D accepting the second bias voltage on line 132, a second S/D connected to the control terminal of the second transistor on line 122, and a gate accepting the second binary logic signal on line 134. A second PMOS 206 has a first S/D accepting the second bias voltage on line 132, a second S/D connected to the control terminal of the second transistor on line 122, and a gate accepting the first binary logic signal on line 128. Inverters 208 and 210 are shown, used to convert the first binary logic signal to the second binary logic signal. In one aspect, the first NMOS 200 and first PMOS 202 are a first complementary MOS (CMOS) device. Likewise, the second NMOS 204 and second PMOS 206 may be a second CMOS device.

Figure 3:
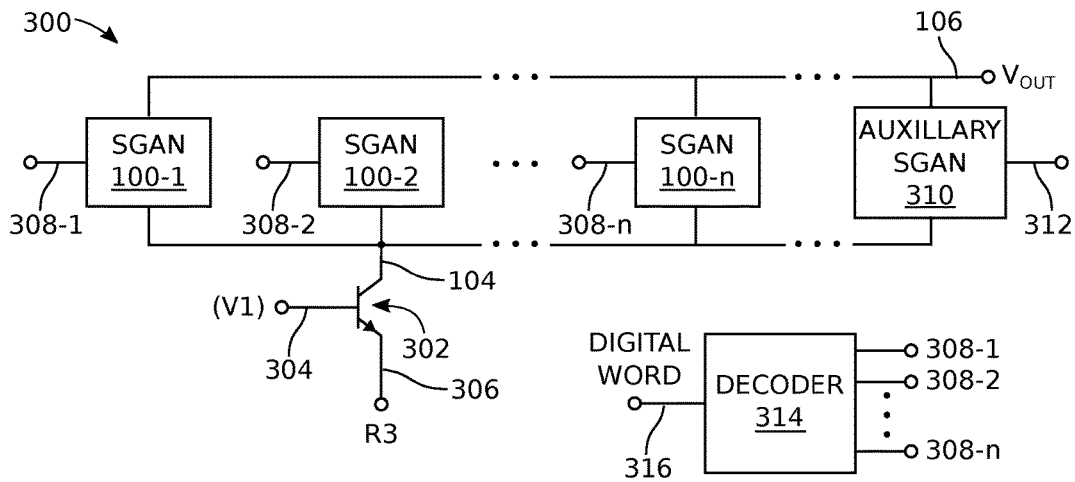
FIG. 3 is a schematic block diagram of a digitally controlled amplifier.

FIG. 3 is a schematic block diagram of a digitally controlled amplifier. The digitally controlled amplifier 300 comprises a drive transistor 302 with a control terminal on line 304 to accept an input AC signal (V1) and a first terminal on line 104 to supply a first stage AC output signal (Vin). In one aspect, as shown, the drive transistor 302 is a common emitter BJT with a base control terminal, a collector first terminal, and an emitter connected to a reference voltage (R3) on line 306. Alternatively but not shown, the drive transistor may be a FET. The digitally controlled amplifier also comprises a plurality of SGANs. SGANs 100-1 through 100-n are shown, where n is an integer not limited to any particular value, except that it is typically greater than 1. Each SGAN 100-1 through 100-n has a signal input connected to the first terminal of the drive transistor on line 104. SGANs 100-1 through 100-n respectively have inputs 308-1 through 308-n to accept a logic signal, and they each have a signal output on line 106 to supply a switchable gain AC output signal to a load (not shown) in response to the logic signals. Details of the SGAN are presented in the explanations of FIGS. 1 and 2, and are not repeated here in the interest of brevity. The plurality of SGAN signal outputs are connected together, typically in parallel as shown on line 106, to supply a digitally controlled AC output gain.

In an optional aspect as shown, the digitally controlled amplifier 300 further comprises an auxiliary SGAN 310 having a signal input connected to the first terminal of the drive transistor on line 104, an input to accept a non-varying enabling logic signal 312, and a signal output to supply a constant gain AC output signal. Alternative stated, and briefly referring to FIG. 2, transistor 102 is always enabled in the auxiliary SGAN, and transistor 118 is always disabled. Returning to FIG. 3, the auxiliary SGAN signal output is connected to the plurality of SGAN signal outputs on line 106.

In one aspect, each SGAN 100-1 through 100-n, as well as auxiliary SGAN 310 if included, has an identical switchable AC high-gain. Further, SGANs 100-1 through 100-n respectively accept independent logic signals 308-1 through 308-n. If n SGAN signal outputs are summed together, they potentially supply (n+1) levels of digitally controlled AC output gain. In a different aspect, the high-gain level of each SGAN may be different, in which case the digitally controlled amplifier could potential provide many more gain levels than (n+1).

Also shown is a digital-to-thermometer decoder 314 having an input on line 316 to accept a binary coded digital signal and thermometer code outputs on lines 308-1 through 308-n. For example, if n=7, then a 3-bit digital word can be used to create a thermometer code of 8 values (n+1), assuming all SGANs have the same high-gain level. In one aspect not shown, the decoder 314 may supply both the logic and complementary logic signals. Alternatively, as shown in FIG. 2, each SGAN can create its own complementary logic signal.

Figure 4:
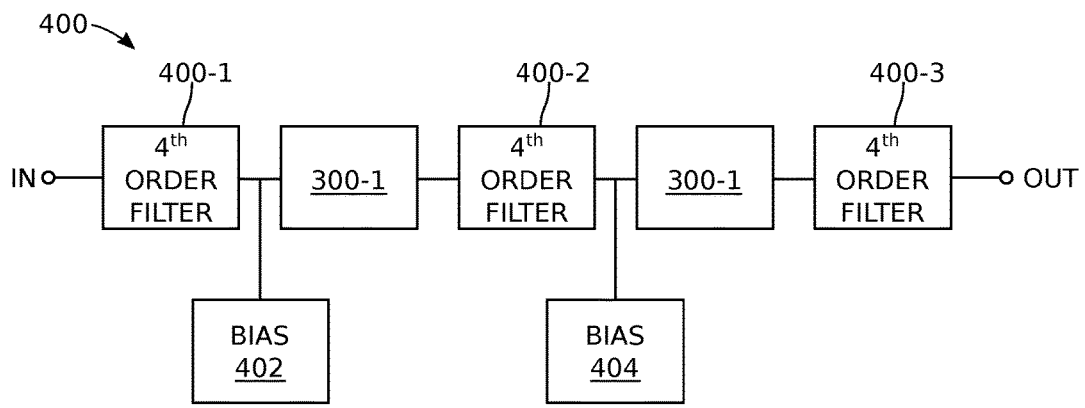
FIG. 4 is a schematic diagram of a digital gain control bandpass amplifier enabled through the use of the above-described digitally controlled amplifier.

FIG. 4 is a schematic diagram of a digital gain control bandpass amplifier enabled through the use of the above-described digitally controlled amplifier. The digital gain control bandpass amplifier 400 uses two digitally controlled amplifiers (DCAs) 300-1 and 300-2. In front of the first and second digitally controlled amplifiers, and after the second DCA 300-2 are fourth-order filters (when considered along with the input impedance of the common-emitter drive transistors), respectively labeled 400-1, 400-2, and 400-3. Separate bias blocks 402 and 404 are used to set the current levels and bias voltages.

A specific example of a V-band digital gain control bandpass amplifier is presented below. The V-band digital gain control bandpass amplifier, DCA, and SGAN were initially derived through extensive modeling.

Circuit Model for Common Emitter Transistor with Emitter Degeneration

Figure 5:
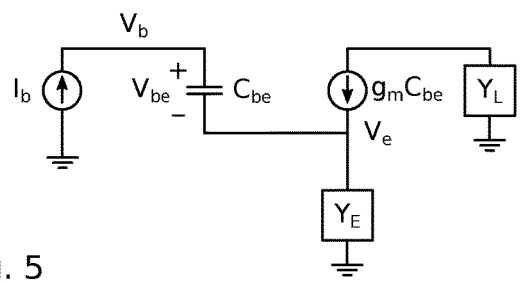
FIG. 5 is a schematic diagram depicting the small-signal model of a common emitter transistor having emitter degeneration impedance $Z_e$.

FIG. 5 is a schematic diagram depicting the small-signal model of a common emitter transistor having emitter degeneration impedance $Z_e$.

We have $$v_b(sC_{be}) - v_{be} = i_b \quad (1)$$

and $$v_e(Y_E + sC_{be}) - v_b sC_{be} = g_m(v_b - v_e) \quad (2)$$

Combining (1) and (2), and solving for $Z_{in} = v_b/i_b$ gives $$Z_{in} = \frac{v_b}{i_b} = \frac{sC_b + g_m + Y_E}{sC_{be}Y_E} \quad (3)$$

For the special case of $Y_E = 1/(sL_E)$, we have $$Z_{in} = sL_E + \frac{1}{(sC_{be})} + \frac{g_m L_E}{C_{be}} \quad (4)$$

Noting that $\omega_t = g_m/C_{be}$, (4) may be re-written as $$Z_{in} = sL_E + \frac{1}{(sC_{be})} + \omega_t L_E \quad (5)$$

Alternative designs might have an additional inductor $L_b$ placed in series with the base; for this case we have $$Z_{in} = s(L_b + L_E) + \frac{1}{(sC_{be})} + \omega_t L_E \quad (6)$$

and we see that at resonance, the input impedance is real and equal to $\omega_t L_E$. Furthermore, the frequency of resonance is given by $$\omega_0 = \frac{1}{\sqrt{C_{be}(L_b + L_E)}} \quad (7)$$

Impedance Transforms.

FIGS. 6A through 6D are schematic diagrams of a Tapped-C impedance transform. In designing the filters for the variable gain receiver, a number of impedance transforms were used. When going from FIGS. 6A to 6B, the resistance and reactance of the two networks is identical at $\omega_0$ if the circuits have the same Q-factors. This results in $$R_2 = \frac{R_1}{1 + Q_1^2} \quad 8)$$

and $$C_2 = C_1 \frac{1 + Q_1^2}{Q_1^2} \quad 9)$$

Figure 6A:
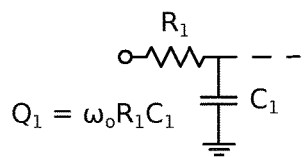
FIGS. 6A through 6D are schematic diagrams of a Tapped-C impedance transform.
Figure 6B:
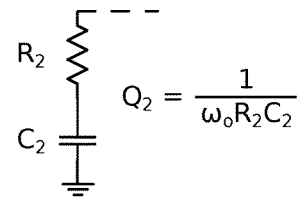
Figure 6C:
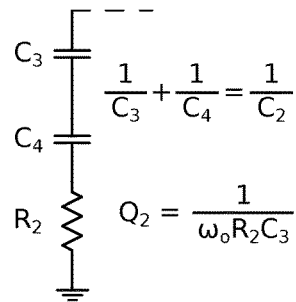
Figure 6D:
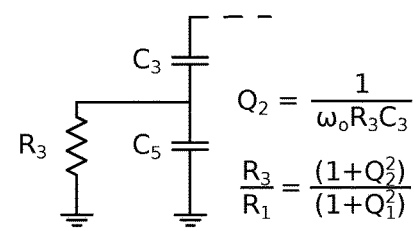

When going from FIGS. 6B to 6C, $C_2$ is replaced by two series capacitors ($C_3$, $C_4$) where the value of the series combination is equal to $C_2$. We now have $$Q_2 = \frac{1}{\omega_0 R_2 C_4} \quad 10)$$

where $Q_2$ is less than $Q_1$. We then use the same transformation as used when going from FIGS. 6A to 6B, but now in the opposite direction. The circuit of FIG. 6D has $$R_3 = R_1 \frac{1 + Q_2^2}{1 + Q_1^2} \quad 11)$$

The value of $Q_2$ is chosen to get the desired ratio of $R_3/R_1$. This transform was used when designing the filter in front of the first stage.

Figure 7A:
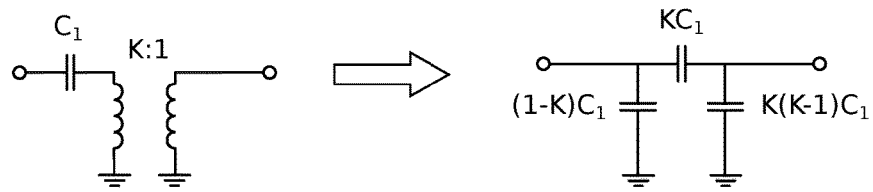
FIGS. 7A and 7B depict an alternative pair of transforms.
Figure 7B:
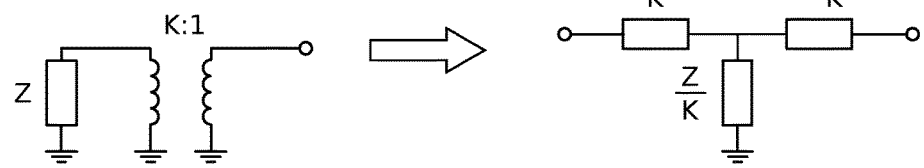

FIGS. 7A and 7B depict an alternative pair of transforms. Norton's first transform is applied to a capacitor in FIG. 7A and Norton's second transform is applied for an arbitrary impedance in FIG. 7B. These transforms can be used to replace either a series element (which is often either a capacitor or an inductor) and an ideal transformer by a pi network having the same type of components, or a shunt component by a T-network. The transformer is obtained by impedance transforming all components to the right of the original series or shunt component. When K>1 the impedances become smaller by $1/K^2$. If the series element is a capacitor, this means the capacitance values become larger. In addition, for K>1, the left element of the pi network is negative and must be absorbed by a positive capacitor to the left of the series network. When replacing a shunt component, the right component of the resulting T-network is negative and must be absorbed by a positive component to its right.

First-Stage Filter.

FIGS. 8A through 8E depict impedance transforms used in designing the first filter. The first-stage filter is based on first designing a second-order low-pass filter, having a maximally-flat pass-band (i.e. $Q=1/\sqrt{2}$) and then transforming this filter to a pass-band filter. This transform can be applied directly to the components of the low-pass filter. An inductor in the low-pass filter, $L_1$ transforms to the series combination of an inductor, $L_2$, and a capacitor $C_2$, where $L_2=L_1/B$ $C_2=1/(\omega_0^2 L_1)$ (12)

With B being the bandwidth in radians, and $\omega_0$ being the center frequency of the bandpass filter (in radians). Similarly, a capacitor, $C_1$, in the low-pass filter transforms to the parallel combination of $L_2$ and $C_2$ where now $L_2=1/(\omega_0^2 C_1)$ $C_2=C_1/B$ (13)

Figure 8A:
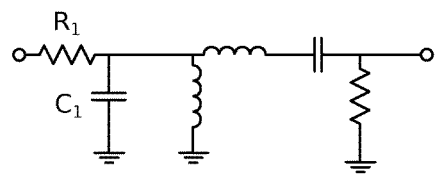
FIGS. 8A through 8E depict impedance transforms used in designing the first filter.
Figure 8B:
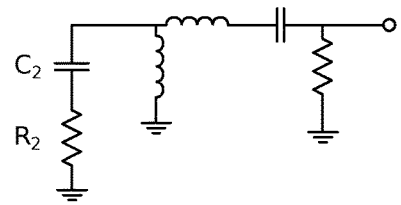
Figure 8C:
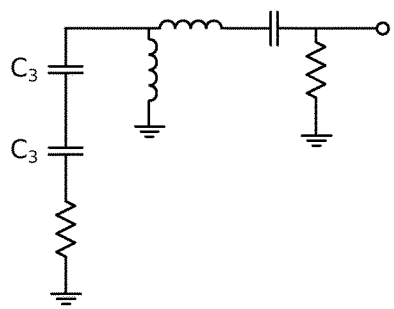
Figure 8D:
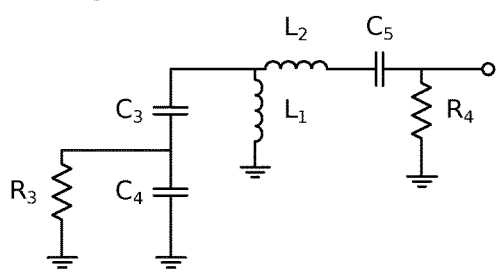
Figure 8E:
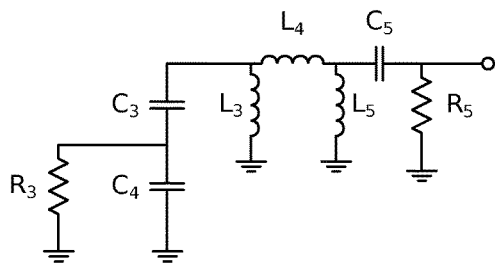

The process for designing the first filter is as follows:

1. Design a second-order low-pass at $\omega_{-3\ dB}=1$ rad. The low-pass prototype was designed to have a bandwidth of 12 GHz, and somewhat arbitrarily to have equal input and output impedances of 50 ohms. These were later modified in a second iteration, which is explained below. Next the low-pass prototype was transformed to the bandpass domain. The resulting network is shown in FIG. 8A.

The values are:

$L_1$=116.2 pH $C_1$=103.0 fC $L_2$=3414.3 pH $C_2$=3.506 fC (14)

Next the tapped-C impedance transform is applied when going from FIG. 8A to FIG. 8D. It was decided to choose $C_3=2C_2$; this results in $Q_2=Q_1/2$. Knowing this fact, then using (11), we see that if we want to end up at circuit (e) having $R_3=50\Omega$, we need to start with $R_1=182.04\Omega$, as $Q_1$ was found to be 5.42115. When going from the circuit in FIG. 8C to 8D, $C_3$ originally having a value of 213.10 femto-farads (fF) transformed to a value of 187.57 fF using (9).

2. In the next step, Norton's First Transform was applied to the series inductor ($L_2$) to transform $R_L$ from 182.04$\Omega$ to 50$\Omega$ using K=$\sqrt{(182.04/50)}$=1.9080. This also transformed the series capacitor from 3.506 femto-coulombs (fC) to 12.764 fC. In the resulting inductive pi network, the left most inductor was negative; this was combined with the parallel inductor ($L_1$) to give $L_3$=119.88 pico-Henrys (pH).

3. The series capacitor $C_h$ is realized by the filter capacitor combined with the capacitance looking into the base of the drive transistor of the first stage. This capacitance ($C_{be}$) was found from simulation by isolating the base (by setting $C_6$ to 0) and injecting an ac current source having a value of unity. The imaginary part of the voltage across the ac current source ($z_{be}$) is used to find $C_{be}$ using $$C_{be} = \frac{-1}{\omega_0 z_{be}} \quad (15)$$

Figure 9:
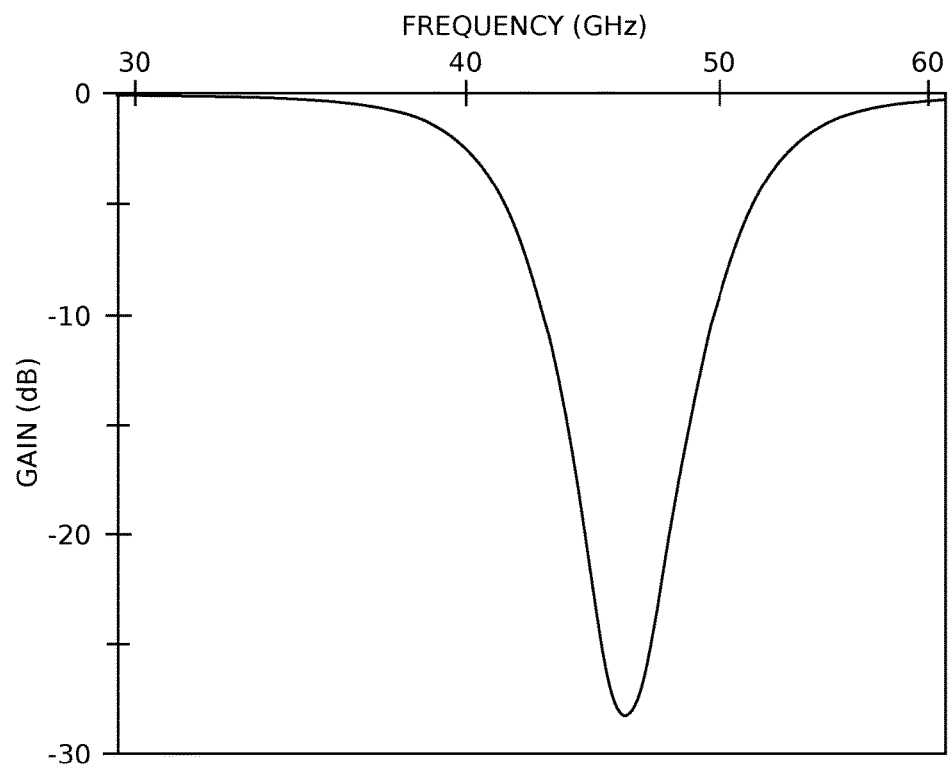
FIG. 9 is a plot of $s_{11}$ return loss of the first stage filter.

FIG. 9 is a plot of $s_{11}$ return loss of the first stage filter.

Once $C_{be}$ was found, the capacitance added was chosen so the series combination of $C_{be}$ and the capacitance added was equal to 12.764 fC, the ideal size of the capacitor.

4. Next, the inductor in series with the emitter was adjusted so that at 46 Gz, the real part of the admittance looking into the base was exactly 50$\Omega$ and the capacitor added was also adjusted so the reactance was equal to that of an ideal 12.765 fC capacitor.

5. The reflection coefficient ($s_{11}$) was found using the formula $$s_{11} = V_{in} \times \frac{Z_{in} - R_s}{Z_{in} + R_s} = V_{in} \times \frac{2Z_{in}}{Z_{in} + R_s} - V_{in} \quad (16)$$

Which can be implemented using two ac voltage sources with the first one having a value of 2 connected to $R_s$ and the second one connected between the right side of $R_s$ and to a node named "s11" (the negative side of the second source). A plot of $S_{11}$ shown in FIG. 9 illustrates the success of this matching process.

Second and Third Filters

Figure 10A:
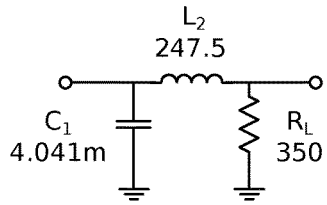
FIGS. 10A through 10C are schematics depicting filter designs.
Figure 10B:
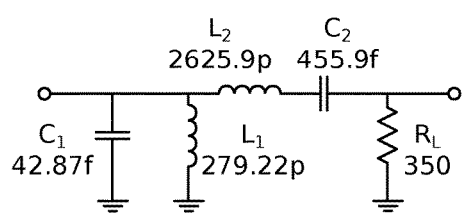
Figure 10C:
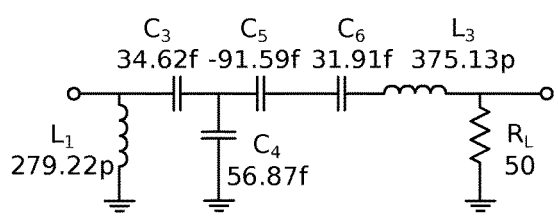

FIGS. 10A through 10C are schematics depicting filter designs. The second and third filters are based on singly-terminated low-pass prototypes. The low-pass prototype is shown in FIG. 10A.

The impedance chosen was 350 ohms. This is transformed to 46 GHz with a 12 GHz bandwidth resulting in the filter shown in FIG. 10B. Next, the output capacitance of the first stage is found using simulation to be 21.338 fF. This is subtracted from the original value for $C_1$ (of 42.872 fF) to give a $C_1$ of 21.534 fF. This value of $C_1$ is then used with Norton's Second Transform to impedance scale the load resistance to 50$\Omega$ as shown in FIG. 10C. The negative capacitor ($C_5$) is left intact for now, as the T-network and $L_1$ resonate at 46 GHz including the output capacitance of the first stage. This resonance is adjusted using the simulator to be exact by adjusting $L_1$. After this step is completed, the negative capacitance is then combined with $C_6$ to get a single capacitor of 48.97 fF. Next, the actual capacitance is adjusted so the input impedance looking into the second stage including the capacitor is equal to 50$\Omega$ in series with 48.97 fF which adjusts the resonance of the second pole of the filter.

After the filters are added to the over-all variable gain receiver, the sizes of $L_1$ are adjusted smaller to give a flat passband while keeping the two filters matched.

Digitally Controlled Amplifier (DCA)

The DCA was designed by replacing the cascode transistor with a switching network that can shunt current away to the power supply. This changes the gain amplifiers to being variable gain amplifiers. In one example, the switch networks are realized using one "always on" switch, and seven switches that could be turned on or off using a binary to thermometer decoder. The schematic of a single switch is shown in FIGS. 1 and 2. The use of transmission gates and bypass capacitors minimizes errors caused by the on-resistance of n-channel only gates.

Figure 11:
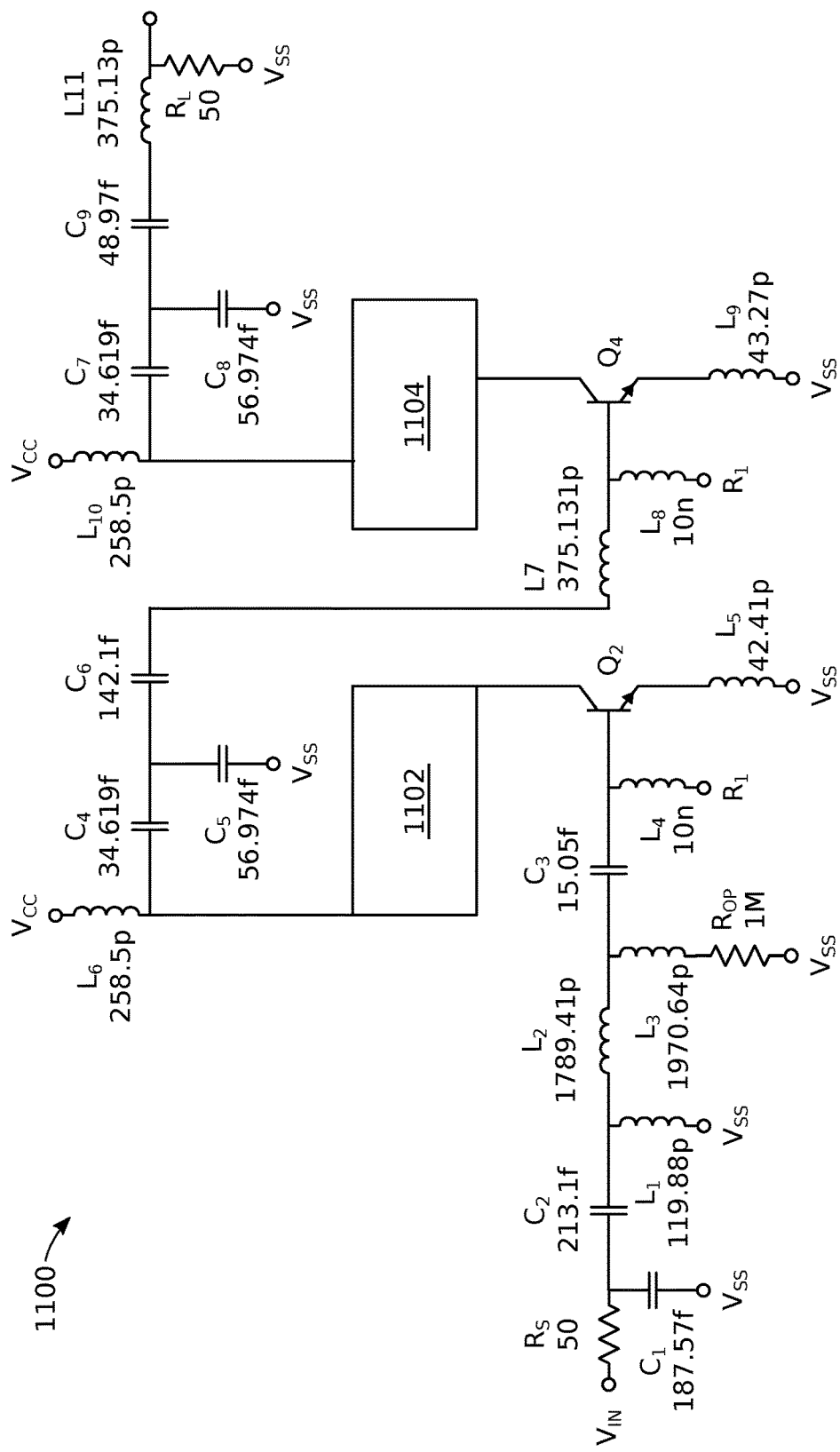
FIG. 11 depicts an exemplary V-band digital gain control amplifier.

FIG. 11 depicts the exemplary V-band digital gain control amplifier 1100. In this design there are 2 DCAs, DCA 1102 and 1104. It is assumed that the source resistor RS is 50Ω and that the output resistance being driven is also 50Ω. The results of the design are listed in Table 1.

TABLE 1

| | |
|---|---|
| Gain | 3.1 dB-40.5 dB |
| Power | 26 mW |
| Supply Voltage | 1.8 V |
| Center Frequencies | 46 GHz |
| Noise Figure | 1.9 dB |
| IIP3 (gain =3.1 dB) | −1.5 dBm |
| OIP3 | 1.6 dBm |
| −1 dB Bandwidth | 8 GHz |
| −3 dB Bandwidth | 10 GHz |
| FOM | 49.6 |

FIG. 12 is a schematic block diagram depicting DCA 1102 in greater detail, except in excluding the drive transistor, which is shown in FIG. 11. DCA 1102 (and 1104 not shown) comprises 8 SGANs. Each of the DCAs is implemented with a cascode architecture. This was done to minimize the effects of the base-collector capacitance ($C_{bc}$) as the cascode transistor minimizes the gain from the base to the collector of the drive transistor. In addition, inductive emitter degeneration was used to improve the noise figure. One (auxiliary) SGAN 310 is always 'ON', the other switches 100-1 through 100-7 can be 'ON' or 'OFF' as determined by a 3-bit digital control. The 3-bit digital control (D[2:0]) on line 316 is decoded into 7 digital thermometer code bits (S[7:0]) 308-1 through 308-7. The number of digital thermometer bits high is equal to the binary value of the 3-bit digital control signal. The 7 digital thermometer code bits control the switches in the DCA. When a thermometer control bit is high, the switch sends its emitter current to the output where it contributes to the gain. Otherwise, the emitter current is switched to the positive output supply.

As shown in FIG. 2, each of the 7 digital thermometer code bits controls two transmission gates inside each switch. One of the transmission gates is on (or at low impedance), and the other one is off or at high impedance. When the digital thermometer code bit is high, then the transmission gate connected to line 110 is a low impedance, connecting line 110 to reference voltage B1, which is nominally 1.55V. In this case, the transmission gate connected to line 122 is off or low impedance. Thus, the base current to transistor 118 is zero, and line 122 falls to a nominal voltage of 1.13V. In this case, transistor 102 is 'ON' and transistor 118 is 'OFF', and all the emitter current goes through transistor 102 to the output contributing to the signal gain.

When the digital thermometer code is low, then line 110 is at 1.13V and transistor 102 is 'OFF'. The voltage on line 122 is 1.55V and transistor 118 is 'ON'. In this case, all the emitter current is shunted through transistor 118 to the positive power supply voltage, and the emitter current does not contribute to the DCA gain.

Figure 13B:
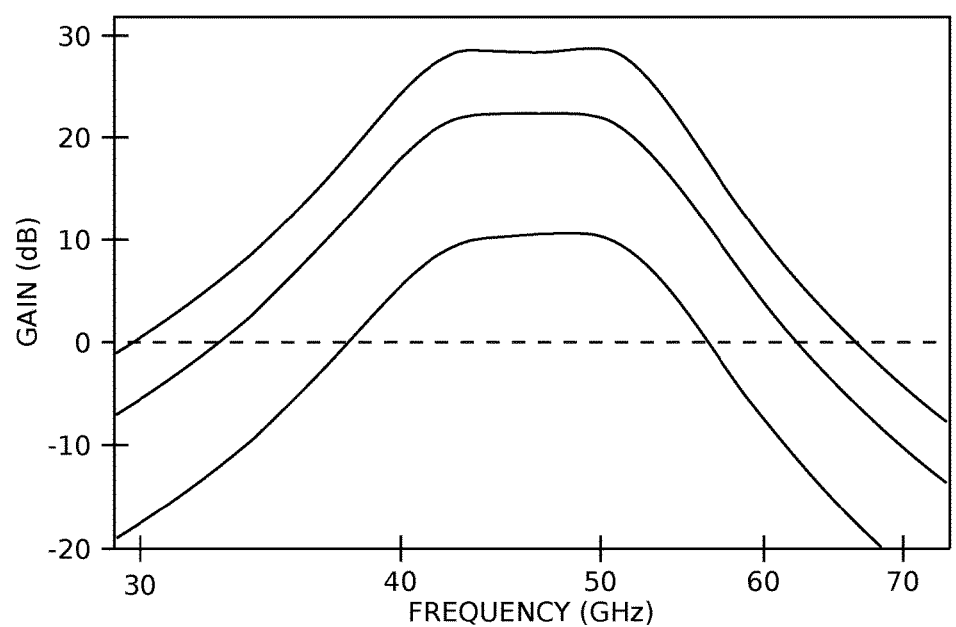
FIG. 13B is a plot depicting three levels of DCA gain.

FIG. 13A depicts a table cross-referencing digital control, thermometer code, and SGAN gain. FIG. 13B is a plot depicting three levels of DCA gain. Each SGAN nominally contributes a gain of 3.29. For example, if the 3-bit digital control has a value of 3, then 3 of the 7 digital thermometer code bits are high. This means 4 switches contribute to the gain current (as one switch is always 'ON'). Since each switch nominally contributes a gain of 3.29, with 4 switches contributing to the gain, the nominal gain is 4×3.29=13.15. This is the same as 22.4 dB.

Simulation Results

Figure 14:
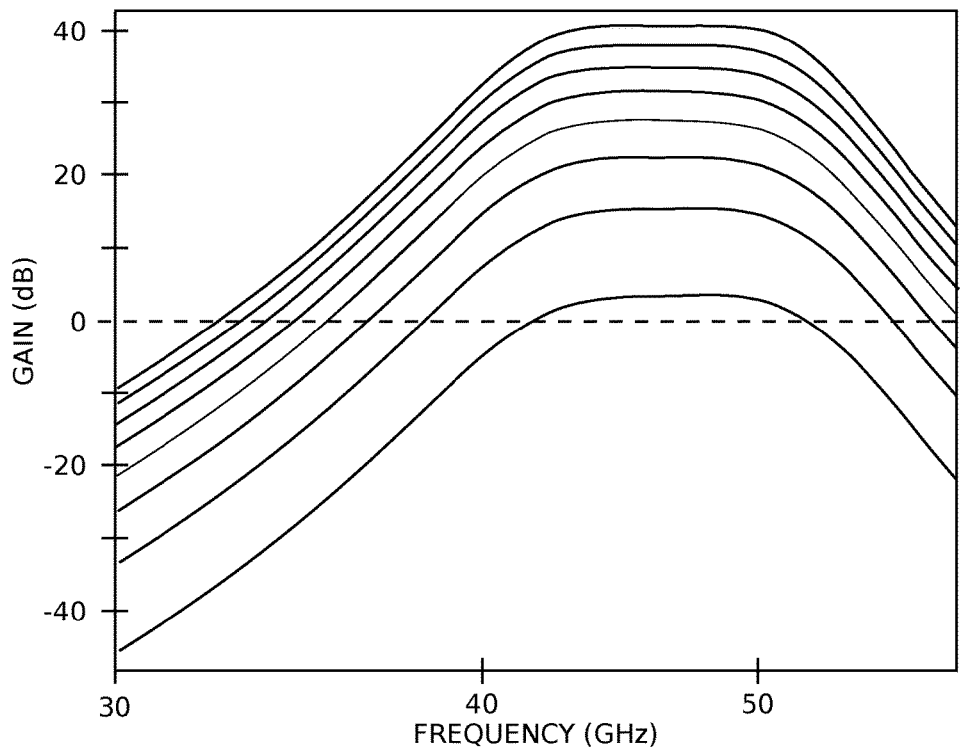
FIG. 14 is a plot depicting gain through the V-band digital gain control bandpass amplifier.

FIG. 14 is a plot depicting gain through the V-band digital gain control bandpass amplifier. The same digital inputs were used for each of the decoders and the values were stepped from the smallest value to the highest. It is seen that the gain range is 3.5 dB to 40.5 dB.

The noise figure was found by turning all noise sources off except for Rs, and running a noise simulation. Next all the noise sources were turned on and the noise simulation was re-run. The difference between the spectral density of the noise at 46 GHz was 1.9 dB.

The output third intercept point (OIP3) and input third intercept point (IIP3) simulations were found by using transient simulations with two sinusoidal inputs, one at 46 GHz, and a second with equal amplitude at 47.25 GHz. Ten periods of the beat frequency (the beat frequency is 1.25 GHz, ten periods is 8 nanoseconds (ns)) were analyzed using a 65536 point fast Fourier transform (FFT). The distortion products were clearly visible. These analyses were done at different input levels and attenuation settings. A typical value with the input power levels at −30 dBm and the minimum gain settings gave OIP3=1.6 dBm, and IIP3=−1.5 dBm.

The figure of merit (FOM) is given by $$\text{FOM}=-\text{NF}+\text{IIP3}-10\ \log(\text{PWR})+\text{GN}_{dB}+10\ \log(F0)+10\ \log(\text{BW}) \tag{17}$$

where NF is the Noise Figure in dB, IIP3 is the input-referred IP3 in dBm, PWR is the Power in mW, $\text{GN}_{dB}$ is the Gain in dB from the input of the V-band amplifier to the output, F0 is the center frequency of the pass-band in GHz, and BW is the pass-band Bandwidth, again in GHz. This FOM is different than most others in that it includes a factor for the bandwidth, as the larger the bandwidth, the more difficult it is to achieve good impedance matching at the input. A different weighting might be considered; for example, it might be argued that the IIP3 and NF terms should be weighted more highly. Since, the design being reported is very good in both these respects, this would favor it even more highly than other designs. The combination of large gain, low noise figure, and high IIP3 give an over-all figure-of-merit of 49.6 which is considerably better than the next best figure-of-merit found in the literature (to date) of 25.6. Many designs reported in the literature are missing critical aspects included in the figure of merit. Many designs realized in a similar silicon-germanium (SiGe) technology, with all parameters reported, have FOMs of around 15-25, considerably less than the reported design.

Figure 15:
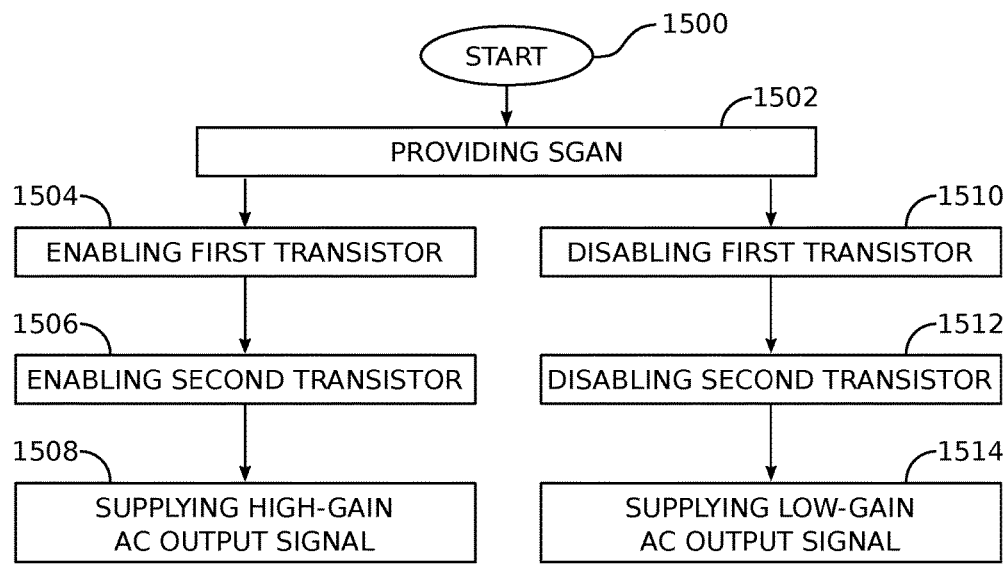
FIG. 15 is a flowchart illustrating method for digitally controlling the gain of an amplifier network.

FIG. 15 is a flowchart illustrating method for digitally controlling the gain of an amplifier network. Although the method is depicted as a sequence of numbered steps for clarity, the numbering does not necessarily dictate the order of the steps. It should be understood that some of these steps may be skipped, performed in parallel, repeated, or performed without the requirement of maintaining a strict order of sequence. Generally however, the method follows the numeric order of the depicted steps, and the details of the method are supported by the explanations of the figures above. The method starts at Step 1500.

Step 1502 provides a SGAN comprising first and second transistors having connected first terminals to accept an input AC signal, and control terminals to accept bias voltages. The first transistor second terminal supplies an AC output signal to a load, and the second transistor second terminal accepts a DC supply voltage. Step 1502 also provides first and second transmission gates respectively connected to the first and second transistor control terminals. Examples of such a SGAN have been presented above in the explanations of FIGS. 1 and 2.

In response to the first transmission gate accepting a logic signal, Step 1504 connects an enabling bias voltage to the first transistor control terminal. In response the second transmission gate accepting a complementary logic signal, Step 1506 connects a disabling bias voltage to the second transistor control terminal. In Step 1508 the first transistor second terminal supplies a high-gain AC output signal. In one aspect, accepting the logic and complementary logic signal in Steps 1504 and 1506 includes converting a binary coded digital word to a thermometer code.

Alternatively, if the first transmission gate accepts the complementary logic signal, Step 1510 connects a disabling bias voltage to the first transistor control terminal. In response the second transmission gate simultaneously accepting the logic signal, Step 1512 connects an enabling bias voltage to the second transistor control terminal. In Step 1514 the first transistor second terminal supply a low-gain AC output signal, lower in gain than the high-gain AC output signal. In one aspect, the low-gain is equal to no gain.

In another aspect, Step 1502 provides a plurality of n SGANs, where n is an integer greater than 1. The n SGANs have their first terminals connected together, and the n SGANs have their first transistor second terminals connected together, as represented in FIGS. 3 and 12. Then, accepting the logic and complementary logic signals in Steps 1504, 1506, 1510, and 1512 includes accepting an independent logic/complementary logic signal for each SGAN. As a result, supplying the high-gain and low-gain AC output signals in Steps 1508 and 1514 includes supplying (n+1) levels of selectable AC output signal gain.

A system and method have been provided for a digitally controlled amplifier enabled by a switchable gain amplifier network. Examples of particular structures, circuit topographies, and device types have been presented to illustrate the invention. However, the invention is not limited to merely these examples. Other variations and embodiments of the invention will occur to those skilled in the art.

I claim:

1. A switchable gain amplifier network (SGAN) comprising:
   a first transistor having a first terminal to accept an input alternating current (AC) signal, a second terminal to supply an AC output signal to a load, and a control terminal;
   a second transistor having a first terminal connected to the first terminal of the first transistor, a second terminal to accept a direct current (DC) supply voltage, and a control terminal;
   a first transmission gate having an input to accept a first bias voltage and an output connected to the control terminal of the first transistor, to supply the first bias voltage in response to receiving a logic signal; and,
   a second transmission gate having an input to accept a second bias voltage and an output connected to the control terminal of the second transistor, to supply the second bias voltage in response to receiving a complementary logic signal, opposite in polarity to the logic signal.

2. The SGAN of claim 1 further comprising:
   a first bypass capacitor having a first terminal connected to the control terminal of the first transistor and a second terminal connected to a first reference voltage; and,
   a second bypass capacitor having a first terminal connected to the control terminal of the second transistor and a second terminal connected to a second reference voltage.

3. The SGAN of claim 1 wherein the first transmission gate comprises:
   a first n-channel metal-oxide-semiconductor field effect transistor (NMOS) having a first source/drain (S/D) accepting the first bias voltage, a second S/D connected to the control terminal of the first transistor, and a gate accepting a first binary logic signal;
   a first p-channel metal-oxide-semiconductor field effect transistor (PMOS) having a first S/D accepting the first bias voltage, a second S/D connected to the control terminal of the first transistor, and a gate accepting a second binary logic signal, opposite in polarity to the first binary logic signal;
   wherein the second transmission gate comprises:
   a second NMOS having a first S/D accepting the second bias voltage, a second S/D connected to the control terminal of the second transistor, and a gate accepting the second binary logic signal; and,
   a second PMOS having a first S/D accepting the second bias voltage, a second S/D connected to the control terminal of the second transistor, and a gate accepting the first binary logic signal.

4. The SGAN of claim 3 wherein the first NMOS and first PMOS are a first complementary MOS (CMOS) device; and,
   wherein the second NMOS and second PMOS are a second CMOS device.

5. The SGAN of claim 1 wherein the first and second transistors are selected from the group consisting of bipolar junction transistors or field effect transistors.

6. A digitally controlled amplifier comprising:
   a drive transistor with a control terminal to accept an input alternating current (AC) signal and a first terminal to supply a first stage AC output signal;
   a plurality of switchable gain amplifier networks (SGANs), each SGAN having a signal input connected to the first terminal of the drive transistor, an input to accept a logic signal, and a signal output to supply a switchable gain AC output signal to a load in response to the logic signal;
   wherein the plurality of SGAN signal outputs are connected together to supply a digitally controlled AC output gain;
   wherein each SGAN comprises:
   a first transistor having a first terminal to accept the first stage AC output signal, a second terminal to supply the switchable gain AC output signal, and a control terminal;
   a second transistor having a first terminal connected to the first terminal of the first transistor, a second terminal to accept a direct current (DC) supply voltage, and a control terminal;
   a first transmission gate having an input to accept a first bias voltage and an output connected to the control terminal of the first transistor, to supply the first bias voltage in response to receiving a logic signal; and,
a second transmission gate having an input to accept a second bias voltage and an output connected to the control terminal of the second transistor, to supply the second bias voltage in response to receiving a complementary logic signal, opposite in polarity to the logic signal.

7. The digitally controlled amplifier of claim 6 further comprising:
an auxiliary SGAN having a signal input connected to the first terminal of the drive transistor, an input to accept a non-varying enabling logic signal, and a signal output to supply a constant gain AC output signal, and wherein the auxiliary SGAN signal output is connected to the plurality of SGAN signal outputs.

8. The digitally controlled amplifier of claim 6 wherein the plurality of SGAN signal outputs are connected in parallel.

9. The digitally controlled amplifier of claim 8 wherein the plurality of SGANs equals n number of SGANs, with each SGAN having an identical switchable AC high-gain, with each SGAN accepting an independent logic signal, and wherein n is an integer greater than 1; and,
wherein the n SGAN signal outputs are summed together to supply (n+1) levels of digitally controlled AC output gain.

10. The digitally controlled amplifier of claim 6 wherein the drive transistor is a common emitter bipolar junction transistor (BJT) with a base control terminal, a collector first terminal, and an emitter connected to a reference voltage.

11. The digitally controlled amplifier of claim 6 wherein each SGAN further comprises:
a first bypass capacitor having a first terminal connected to the control terminal of the first transistor and a second terminal connected to a first reference voltage; and,
a second bypass capacitor having a first terminal connected to the control terminal of the second transistor and a second terminal connected to a second reference voltage.

12. The digitally controlled amplifier of claim 6 wherein the first transmission gate comprises:
a first n-channel metal-oxide-semiconductor field effect transistor (NMOS) having a first source/drain (S/D) accepting the first bias voltage, a second S/D connected to the control terminal of the first transistor, and a gate accepting a first binary logic signal;
a first p-channel metal-oxide-semiconductor field effect transistor (PMOS) having a first S/D accepting the first bias voltage, a second S/D connected to the control terminal of the first transistor, and a gate accepting a second binary logic signal, opposite in polarity to the first binary logic signal;
wherein the second transmission gate comprises:
a second NMOS having a first S/D accepting the second bias voltage, a second S/D connected to the control terminal of the second transistor, and a gate accepting the second binary logic signal; and,
a second PMOS having a first S/D accepting the second bias voltage, a second S/D connected to the control terminal of the second transistor, and a gate accepting the first binary logic signal.

13. The digitally controlled amplifier of claim 12 wherein the first NMOS and first PMOS are a first complementary MOS (CMOS) device; and,
wherein the second NMOS and second PMOS are a second CMOS device.

14. The digitally controlled amplifier of claim 6 wherein the first and second transistors are selected from the group consisting of bipolar junction transistors or field effect transistors.

15. The digitally controlled amplifier of claim 6 further comprising:
a digital-to-thermometer decoder having an input to accept a binary coded digital signal and outputs to supply thermometer coded logic signals for switching the AC gain of each SGAN.

16. A method for digitally controlling the gain of an amplifier network, the method comprising:
providing a switchable gain amplifier network (SGAN) comprising:
first and second transistors having connected first terminals to accept an input alternating current (AC) signal, control terminals to accept bias voltages, a first transistor second terminal to supply an AC output signal to a load, and a second transistor second terminal to accept a direct current (DC) supply voltage;
first and second transmission gates respectively connected to the first and second transistor control terminals;
in response to the first transmission gate accepting a logic signal, connecting an enabling bias voltage to the first transistor control terminal;
in response the second transmission gate accepting a complementary logic signal, connecting a disabling bias voltage to the second transistor control terminal; and,
the first transistor second terminal supplying a high-gain AC output signal.

17. The method of claim 16 further comprising:
in response to the first transmission gate accepting the complementary logic signal, connecting a disabling bias voltage to the first transistor control terminal;
in response to the second transmission gate simultaneously accepting the logic signal, connecting an enabling bias voltage to the second transistor control terminal; and,
the first transistor second terminal supplying a low-gain AC output signal, lower in gain than the high-gain AC output signal.

18. The method of claim 17 wherein providing the SGAN includes providing a plurality of n SGANs, where n is an integer greater than 1, with the n SGANs having their first terminals connected together, and with the n SGANs having their first transistor second terminals connected together;
wherein accepting the logic and complementary logic signals includes accepting an independent logic/complementary logic signal for each SGAN; and,
wherein supplying the high-gain and low-gain AC output signals includes supplying (n+1) levels of selectable AC output signal gain.

19. The method of claim 16 wherein accepting the logic and complementary logic signal includes converting a binary coded digital word to a thermometer code.

* * * * *

UNITED STATES PATENT AND TRADEMARK OFFICE
CERTIFICATE OF CORRECTION

PATENT NO. : 10,348,263 B1
APPLICATION NO. : 16/106339
DATED : July 9, 2019
INVENTOR(S) : Kenneth Martin It is certified that error appears in the above-identified patent and that said Letters Patent is hereby corrected as shown below:

On the Title Page

Item (73) Assignee name has been incorrectly printed as "I-Q Analog Corporation". The name of the Assignee is actually "IQ-Analog Corporation".

Signed and Sealed this
Second Day of November, 2021

Drew Hirshfeld
*Performing the Functions and Duties of the*
*Under Secretary of Commerce for Intellectual Property and*
*Director of the United States Patent and Trademark Office*